United States Patent
Tian et al.

(10) Patent No.: US 7,940,840 B2
(45) Date of Patent: May 10, 2011

(54) DUAL BARREL RECEIVER EQUALIZATION ARCHITECTURE

(75) Inventors: Kathy Tian, Sunnyvale, CA (US);
Marlene P. Chan, San Jose, CA (US);
Harry Muljono, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 687 days.

(21) Appl. No.: 12/006,277

(22) Filed: Dec. 31, 2007

(65) Prior Publication Data

US 2009/0167402 A1    Jul. 2, 2009

(51) Int. Cl.
*H03H 7/30* (2006.01)
(52) U.S. Cl. .................................. 375/229
(58) Field of Classification Search .......... 375/229–236, 375/316, 318; 327/52, 89, 96, 127, 246, 327/266, 274, 280, 287, 307, 359, 563; 333/18, 28 R; 708/300, 322, 323; 379/340, 398
See application file for complete search history.

(56) References Cited

U.S. PATENT DOCUMENTS

| | | | |
|---|---|---|---|
| 7,778,286 B2 * | 8/2010 | Agazzi et al. | 370/516 |
| 2006/0006945 A1 * | 1/2006 | Burns et al. | 330/295 |

* cited by examiner

*Primary Examiner* — Sam K Ahn
(74) *Attorney, Agent, or Firm* — Caven & Aghevli LLC

(57) ABSTRACT

Methods and apparatus relating to dual barrel receiver equalization architectures are described. In an embodiment, a receiver logic may include an amplifier and two comparators to equalize frequency components of a received signal. The receiver logic may further include offset adjustment (or cancelation) logic to generate an offset adjustment (or cancelation) signal coupled to the amplifier. Other embodiments are also described.

20 Claims, 4 Drawing Sheets

DUAL BARREL RECEIVER EQUALIZATION ARCHITECTURE

BACKGROUND

The present disclosure generally relates to the field of electronics. More particularly, an embodiment of the invention generally relates to dual barrel receiver equalization architectures.

Increasing speeds have resulted in signal degradation over long (e.g., motherboard) traces. Signal degradation may be caused by dielectric losses and line discontinuities with improperly matched impedances between the transmitter, transmission line, and receiver. Equalization generally attempts to equalize frequency components of a received signal to compensate for high frequency loss along the transmission channel.

Some implementations may be operational if there are no mismatches between differential input signal paths and there are no mismatches between the output signal paths of a receiver. However, due to process variations such as random doping fluctuations in the transistor channel, even if these paths are closely matched and the circuits are in very close proximity, there may be a significant mismatch in practice.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Some embodiments may provide receiver (RX) equalization (EQ) architecture based on a Continuous Time Linear Equalization (CTLE) design (e.g., with offset adjustment or cancelation). As discussed herein, the terms "cancel" or "cancelation" and their derivatives may be interchangeable with "adjust" or "adjustment." Equalization may generally refer to the attempt at equalizing the frequency components of a received signal to compensate for high frequency loss along the transmission channel. Moreover, receiver equalization (RX EQ) may be used in some interfaces (such as a CSI (Common System Interface)) to mitigate the Inter-symbol Interference (ISI) associated with high speed switching. In one embodiment, a CTLE architecture may be utilized to minimize the voltage offset. In an embodiment, a dual barrel CTLE architecture may be utilized, e.g., to minimize the voltage offset on two interleaving sampling paths (where each path corresponds to one barrel of the CTLE architecture, for example). Some of the embodiments discussed herein may be utilized in various computing environments such as those discussed with reference to FIGS. 1 and 4-5.

Figure 1:
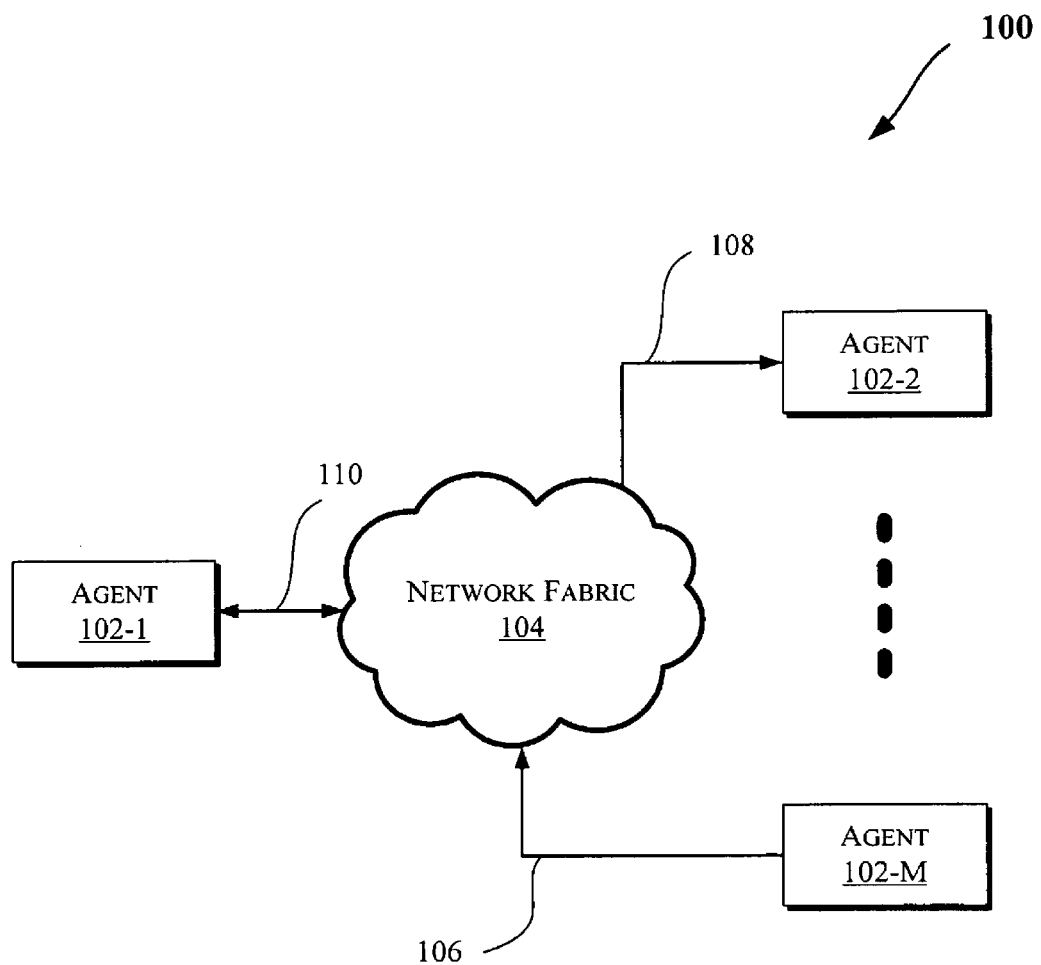
FIGS. 1 and 4-5 illustrate block diagrams of embodiments of computing systems, which may be utilized to implement various embodiments discussed herein.

More particularly, FIG. 1 illustrates a block diagram of a computing system 100, according to an embodiment of the invention. The system 100 may include one or more agents 102-1 through 102-M (collectively referred to herein as "agents 102" or more generally "agent 102"). In an embodiment, the agents 102 may be components of a computing system, such as the computing systems discussed with reference to FIGS. 2-5.

As illustrated in FIG. 1, the agents 102 may communicate via a network fabric 104. In one embodiment, the network fabric 104 may include a computer network that allows various agents (such as computing devices) to communicate data. In an embodiment, the network fabric 104 may include one or more interconnects (or interconnection networks) that communicate via a serial (e.g., point-to-point) link and/or a shared communication network. For example, some embodiments may facilitate component debug or validation on links that allow communication with fully buffered dual in-line memory modules (FBD), e.g., where the FBD link is a serial link for coupling memory modules to a host controller device (such as a processor or memory hub). Debug information may be transmitted from the FBD channel host such that the debug information may be observed along the channel by channel traffic trace capture tools (such as one or more logic analyzers).

In one embodiment, the system 100 may support a layered protocol scheme, which may include a physical layer, a link layer, a routing layer, a transport layer, and/or a protocol layer. The fabric 104 may further facilitate transmission of data (e.g., in form of packets) from one protocol (e.g., caching processor or caching aware memory controller) to another protocol for a point-to-point or shared network. Also, in some embodiments, the network fabric 104 may provide communication that adheres to one or more cache coherent protocols.

Furthermore, as shown by the direction of arrows in FIG. 1, the agents 102 may transmit and/or receive data via the network fabric 104. Hence, some agents may utilize a unidirectional link while others may utilize a bidirectional link for communication. For instance, one or more agents (such as agent 102-M) may transmit data (e.g., via a unidirectional link 106), other agent(s) (such as agent 102-2) may receive data (e.g., via a unidirectional link 108), while some agent(s) (such as agent 102-1) may both transmit and receive data (e.g., via a bidirectional link 10).

Figure 2:
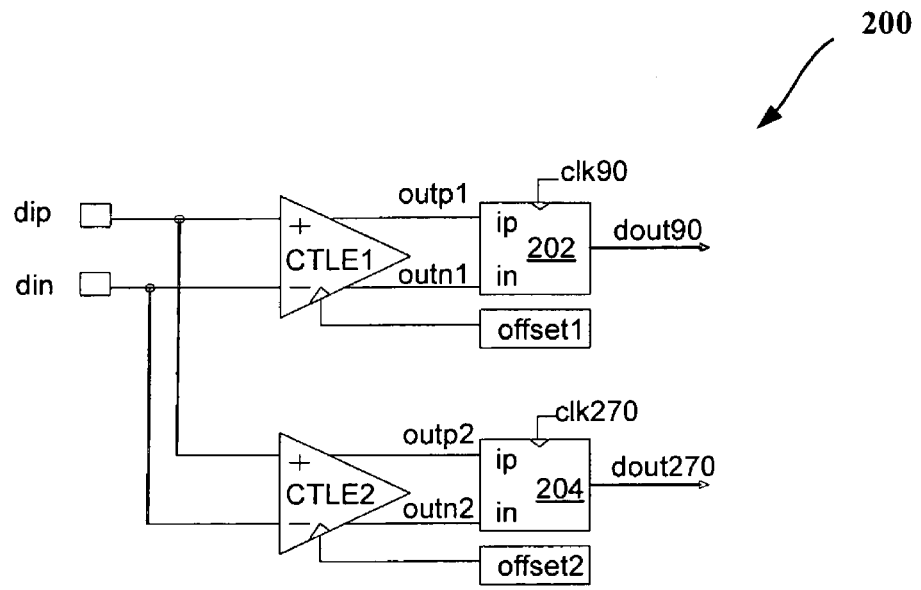
FIGS. 2-3 illustrate block diagrams of various logic that may be used in some embodiments of the invention.

FIG. 2 illustrates a block diagram of a dual barrel CTLE circuit 200, according to an embodiment. As shown in FIG. 2, the circuit 200 may employ two parallel paths, where each path includes a CTLE amplifier (e.g., controlled by an offset logic) and a comparator.

For example, a first path (shown in the upper portion of FIG. 2) may include an amplifier (CTLE1) controlled by an offset adjustment/cancelation logic (offset1) and a comparator 202 to compare the outputs of CTLE1 and generate an output signal (dout90). As shown in FIG. 2, the comparator 202 may be clocked by a clock signal (clk9O). Further, a second path (shown in the lower portion of FIG. 2) may include an amplifier (CTLE2) controlled by an offset adjustment/cancelation logic (offset2) and a comparator 204 to compare the outputs of CTLE2 and generate an output signal (dout270). As shown in FIG. 2, the comparator 204 may be clocked by a clock signal (clk270). In an embodiment, the comparator clock signals (dout90 and dout270) may be interleaved, e.g., out of phase by 180 degrees in some embodiments. In an embodiment, the circuit 200 may provide an ability to adjust inherent voltage offset of the input sampling paths while using RX EQ. For example, input offset of odd and even data may provide a relatively low offset voltage (e.g., less than 10 mV) in some embodiments.

Further, even though FIG. 2 illustrates a dual parallel path design, other embodiments may include a single CTLE amplifier with a single offset logic providing two outputs to two comparators being clocked by two interleaved clocks (such as clk90 and clk270). For example, the differential input data "dip" and "din" may be received and equalized by one CTLE and the differential outputs of CTLE may be sampled by two interleaved comparators. The single CTLE (or the dual CTLE shown in FIG. 2) may have offset cancelation capability. Since in some implementations, the comparator offset distribution may match a Gaussian distribution, the offset may be random. For example, the "dout90" comparator could have a positive input offset voltage above the input common mode voltage (Vcm) and the "dout270" comparator could have a negative input offset voltage lower than Vcm. Accordingly, having multiple offset cancelation logics (one for each path) may provide more efficient offset cancelation capability in some embodiments.

Furthermore, the implementation of circuit 200 shown in FIG. 2 may result in the "dout90" and "dout270" paths having their own offset cancelation circuits (e.g., offset1 and offset2) . Hence, the CTLE plus comparator offset of a given whole path may be cancelled by the offset cancelation circuit residing within the same path. Therefore, the residual offset may be minimal and the receiver Common-Mode Rejection Ratio (CMRR) and Power Supply Rejection Ratio (PSRR) stay relatively higher than with implementations that may utilize a single offset adjustment/cancelation circuit across multiple paths. Additionally, with the dual barrel implementation, the receiver training time may be reduced by half in some embodiments. In particular, the training of the dout90 path and the dout270 path may be done in parallel. This reduces the training time from about 10 micro-second to 5 micro-second in some cases.

Figure 3:
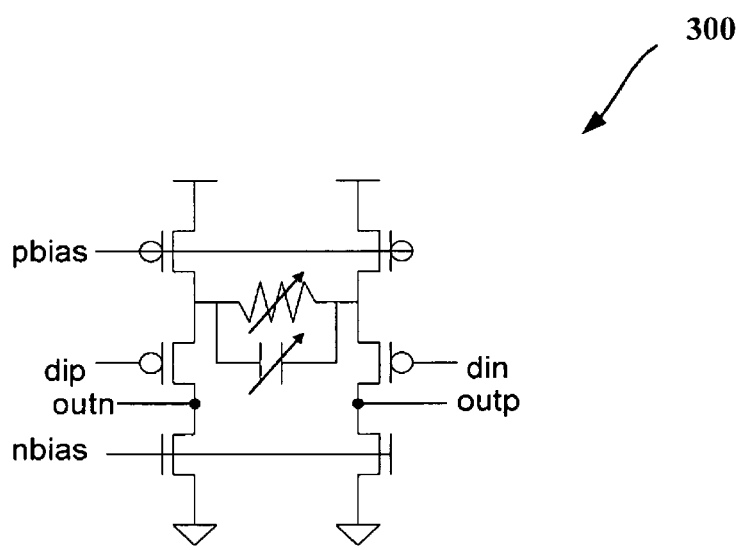

FIG. 3 illustrates an embodiment of a CTLE circuit 300, according to an embodiment. At least one RX EQ embodiment (e.g., such as the embodiment shown in FIG. 2) may employ the CTLE 300 that includes of a linear amp with gain greater than 1 to amplify the incoming signal (e.g., from input nodes dip and din) along with adjustable resistance (R) and capacitance (C) components such as shown in FIG. 3, e.g., to control high frequency versus low frequency gain.

In an embodiment, the CTLE1 and CTLE2 of FIG. 2 may include the components shown in FIG. 3 with respect to the circuit 300. Further, the pbias input of the circuit 300 may be coupled to a bias generation circuit (not shown). The nbias input of the circuit 300 may be coupled to an offset adjustment/cancelation logic (e.g., offset1 and/or offset2 logics of FIG. 2). Further, the outputs of circuit 300 may be coupled to one or more comparators such as discussed and shown in FIG. 2 in some embodiments.

Figure 4:
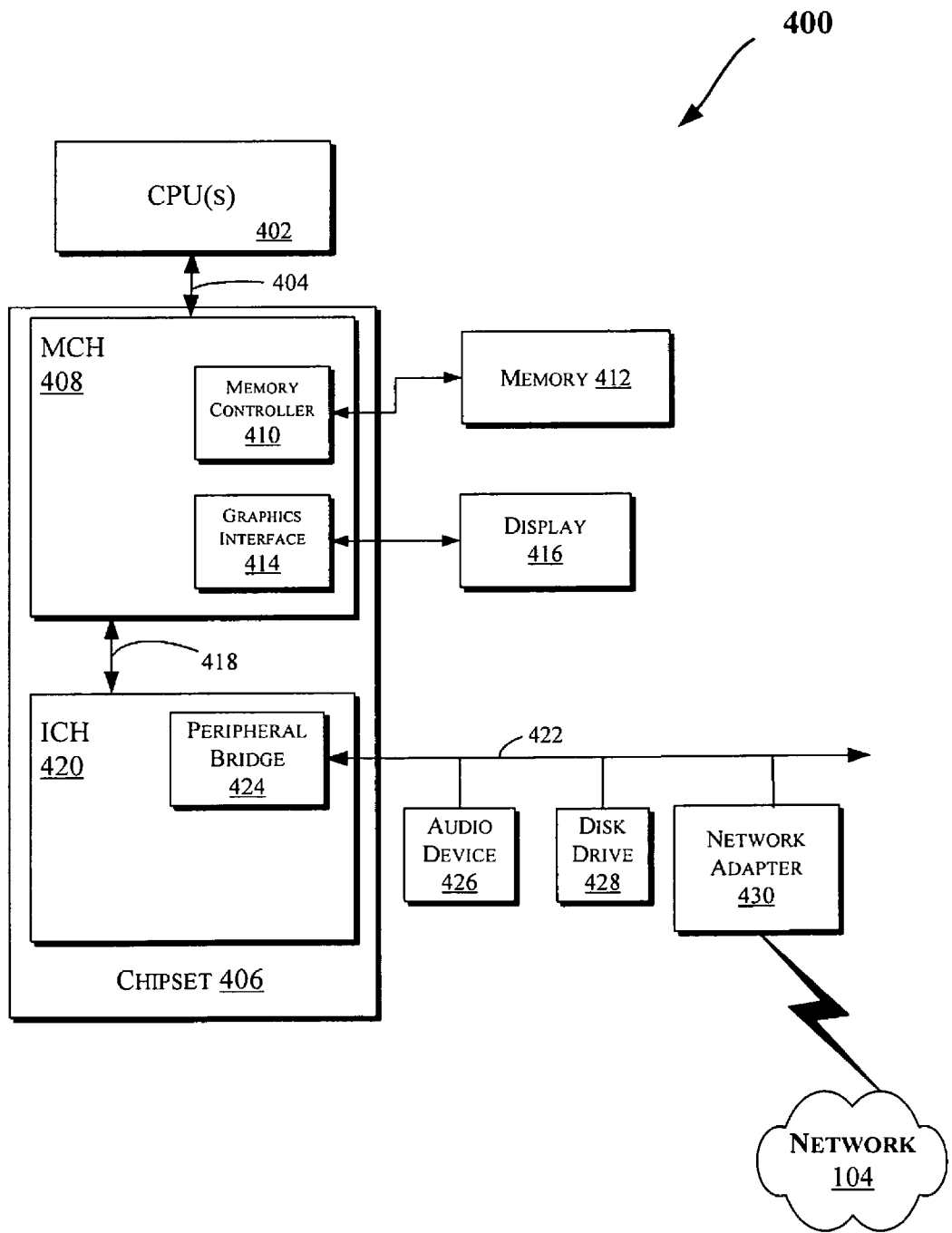

FIG. 4 illustrates a block diagram of an embodiment of a computing system 400. One or more of the components of FIG. 1 may comprise one or more components discussed with reference to the computing system 400. Also, one or more components of system 400 may include components discussed with reference to FIGS. 1-3. The computing system 400 may include one or more central processing unit(s) (CPUs) 402 (which may be collectively referred to herein as "processors 402" or more generically "processor 402") coupled to an interconnection network (or bus) 404. The processors 402 may be any type of processor such as a general purpose processor, a network processor (which may process data communicated over a computer network 104), etc. (including a reduced instruction set computer (RISC) processor or a complex instruction set computer (CISC)). Moreover, the processors 402 may have a single or multiple core design. The processors 402 with a multiple core design may integrate different types of processor cores on the same integrated circuit (IC) die. Also, the processors 402 with a multiple core design may be implemented as symmetrical or asymmetrical multiprocessors.

The processor 402 may include one or more caches (not shown), which may be private and/or shared in various embodiments. Generally, a cache stores data corresponding to original data stored elsewhere or computed earlier. To reduce memory access latency, once data is stored in a cache, future use may be made by accessing a cached copy rather than refetching or recomputing the original data. The cache(s) may be any type of cache, such a level 1 (L1) cache, a level 2 (L2) cache, a level 3 (L-3), a mid-level cache, a last level cache (LLC), etc. to store electronic data (e.g., including instructions) that is utilized by one or more components of the system 400.

A chipset 406 may additionally be coupled to the interconnection network 404. Further, the chipset 406 may include a memory control hub (MCH) 408. The MCH 408 may include a memory controller 410 that is coupled to a memory 412. In an embodiment, the MCH may also include graphics logic and as a result may be referred to as a graphics MCH (GMCH). The memory 412 may store data, e.g., including sequences of instructions that are executed by the processor 402, or any other device in communication with components of the computing system 400. Also, in one embodiment of the invention, the memory 412 may include one or more volatile storage (or memory) devices such as random access memory (RAM), dynamic RAM (DRAM), synchronous DRAM (SDRAM), static RAM (SRAM), etc. Nonvolatile memory may also be utilized such as a hard disk. Additional devices may be coupled to the interconnection network 404, such as multiple processors and/or multiple system memories.

The MCH 408 may further include a graphics interface 414 coupled to a display device 416 (e.g., via a graphics accelerator in an embodiment). In one embodiment, the graphics interface 414 may be coupled to the display device 416 via an accelerated graphics port (AGP). In an embodiment of the invention, the display device 416 (such as a flat panel display) may be coupled to the graphics interface 414 through, for example, a signal converter that translates a digital representation of an image stored in a storage device such as video memory or system memory (e.g., memory 412) into display signals that are interpreted and displayed by the display 416.

As shown in FIG. 4, a hub interface 418 may couple the MCH 408 to an input/output control hub (ICH) 420. The ICH 420 may provide an interface to input/output (I/O) devices coupled to the computing system 400. The ICH 420 may be coupled to a bus 422 through a peripheral bridge (or controller) 424, such as a peripheral component interconnect (PCI) bridge that may be compliant with the PCIe specification, a universal serial bus (USB) controller, etc. The bridge 424 may provide a data path between the processor 402 and peripheral devices. Other types of topologies may be utilized. Also, multiple buses may be coupled to the ICH 420, e.g., through multiple bridges or controllers. For example, the bus 422 may comply with the PCI Local Bus Specification, Revision 4.0, Mar. 9, 4004, available from the PCI Special Interest Group, Portland, Oreg., U.S.A. (hereinafter referred to as a "PCI bus"). Alternatively, the bus 422 may comprise a bus that complies with the PCI-X Specification Rev. 4.0a, Apr. 43, 4003, (hereinafter referred to as a "PCI-X bus") and/or PCIe specification, available from the aforesaid PCI Special Interest Group, Portland, Oreg., U.S.A. Further, the bus 422 may comprise other types and configurations of bus systems. Moreover, other peripherals coupled to the ICH 420 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), etc.

The bus 422 may be coupled to an audio device 426, one or more disk drive(s) 428, and a network adapter 430 (which may be a NIC in an embodiment). In one embodiment, the network adapter 430 or other devices coupled to the bus 422 may communicate with the chipset 406. Other devices may be coupled to the bus 422. Also, various components (such as the network adapter 430) may be coupled to the MCH 408 in some embodiments of the invention. In addition, the processor 402 and other components shown in FIG. 4 (including but not limited to the MCH 408, one or more components of the MCH 408, etc.) may be combined to form a single chip. Furthermore, a graphics accelerator may be included within the MCH 408 in other embodiments of the invention.

Additionally, the computing system 400 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 428), a floppy disk, a compact disk ROM (CD-ROM), a digital versatile disk (DVD), flash memory, a magneto-optical disk, or other types of nonvolatile machine-readable media capable of storing electronic data (e.g., including instructions).

Figure 5:
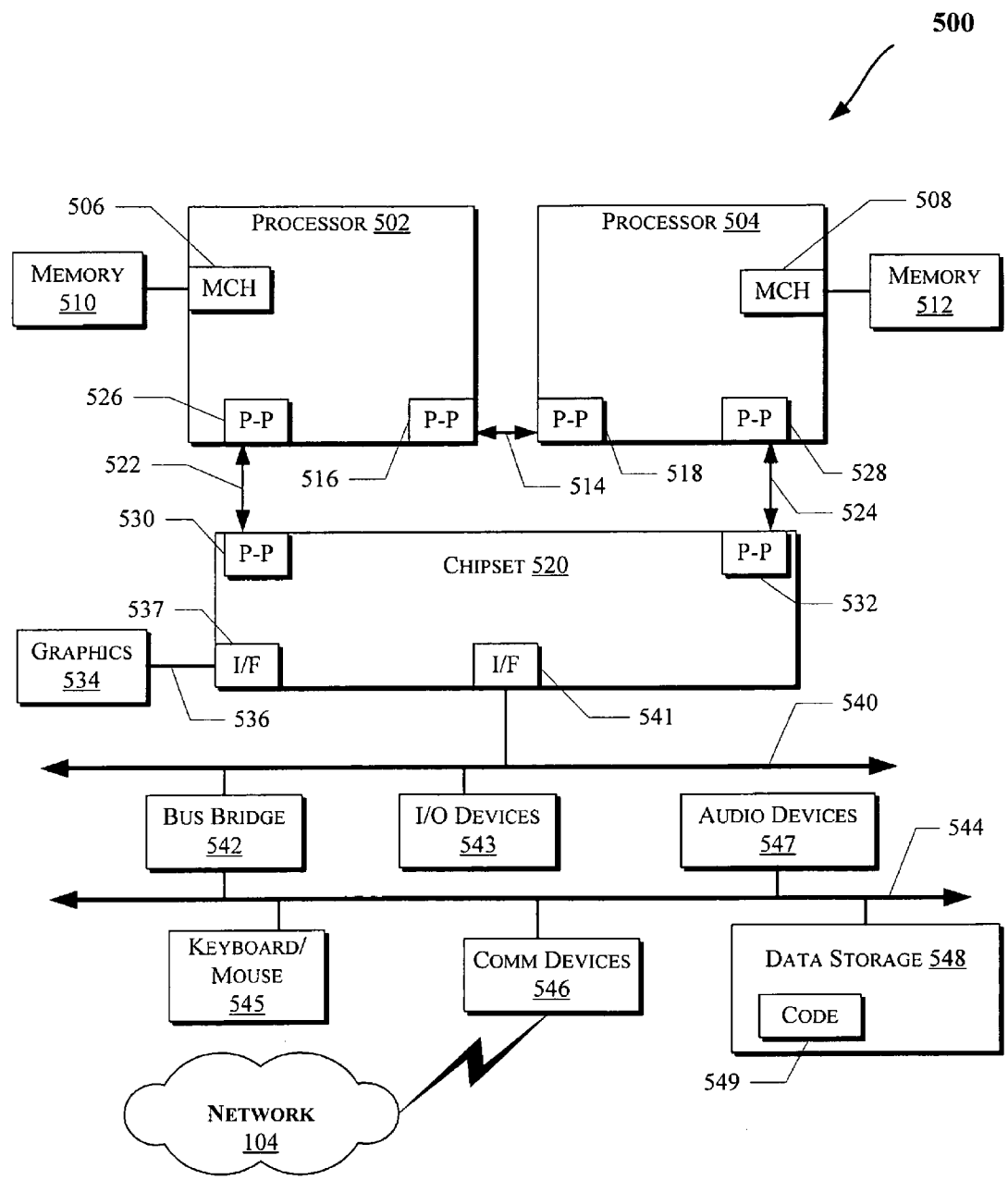

FIG. 5 illustrates a computing system 500 that is arranged in a point-to-point (PtP) configuration, according to an embodiment of the invention. In particular, FIG. 5 shows a system where processors, memory, and input/output devices are interconnected by a number of point-to-point interfaces. The operations discussed with reference to FIGS. 1-4 may be performed by one or more components of the system 500.

As illustrated in FIG. 5, the system 500 may include several processors, of which only two, processors 502 and 504 are shown for clarity. The processors 502 and 504 may each include a local memory controller hub (MCH) 506 and 508 to enable communication with memories 510 and 512. The memories 510 and/or 512 may store various data such as those discussed with reference to the memory 412 of FIG. 4. As shown in FIG. 5, the processors 502 and 504 may also include one or more cache(s) discussed with reference to FIG. 4. In an embodiment, the processors 502 and 504 may be one of the processors 402 discussed with reference to FIG. 4. The processors 502 and 504 may exchange data via a point-to-point (PtP) interface 514 using PtP interface circuits 516 and 518, respectively. Also, the processors 502 and 504 may each exchange data with a chipset 520 via individual PtP interfaces 522 and 524 using point-to-point interface circuits 526, 528, 530, and 532. The chipset 520 may further exchange data with a high-performance graphics circuit 534 via a high-performance graphics interface 536, e.g., using a PtP interface circuit 537.

In at least one embodiment, one or more operations discussed with reference to FIGS. 1-5 may be performed by the processors 502 or 504 and/or other components of the system 500 such as those communicating via a bus 540. Other embodiments of the invention, however, may exist in other circuits, logic units, or devices within the system 500 of FIG. 5. Furthermore, other embodiments of the invention may be distributed throughout several circuits, logic units, or devices illustrated in FIG. 5. Chipset 520 may communicate with the bus 540 using a PtP interface circuit 541. The bus 540 may have one or more devices that communicate with it, such as a bus bridge 542 and I/O devices 543. Via a bus 544, the bus bridge 542 may communicate with other devices such as a keyboard/mouse 545, communication devices 546 (such as modems, network interface devices, or other communication devices that may communicate with the computer network 104), audio I/O device, and/or a data storage device 548. The data storage device 548 may store code 549 that may be executed by the processors 502 and/or 504.

In various embodiments of the invention, the operations discussed herein, e.g., with reference to FIGS. 1-5, may be implemented as hardware (e.g., logic circuitry), software, firmware, or combinations thereof, which may be provided as a computer program product, e.g., including a machine-readable or computer-readable medium having stored thereon instructions (or software procedures) used to program a computer to perform a process discussed herein. The machine-readable medium may include a storage device such as those discussed herein. Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection).

Reference in the specification to "one embodiment," "an embodiment," or "some embodiments" means that a particular feature, structure, or characteristic described in connection with the embodiment(s) may be included in at least an implementation. The appearances of the phrase "in one embodiment" in various places in the specification may or may not be all referring to the same embodiment. Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An integrated circuit device comprising:
a first amplifier coupled to receive a first offset adjustment signal from a first offset adjustment logic and a pair of input differential communication signals, wherein the first amplifier is to generate a first pair of differential output signals based on the input differential signals and the first offset adjustment signal;
a second amplifier coupled to receive a second offset adjustment signal from a second offset adjustment logic and the pair of input differential communication signals, wherein the second amplifier is to generate a second pair of differential output signals based on the input differential signals and the second offset adjustment signal, wherein the first offset adjustment logic is to generate the first offset adjustment signal based on a first sampling path and the second offset adjustment logic is to generate the second offset adjustment signal based on a second sampling path; and
a first comparator to compare the first pair of differential output signals and a second comparator to compare the second pair of differential output signals.

2. The device of claim 1, wherein the first sampling path and the second sampling path are interleaved.

3. The device of claim 1, wherein the first comparator and the second comparator are to be clocked by clock signals that are interleaved.

4. The device of claim 3, wherein the clock signals are 180 degrees out of phase.

5. The device of claim 1, wherein the first comparator is to generate a first comparator output signal that is interleaved with a second comparator output signal, wherein the second comparator is to generate the second comparator output signal.

6. The device of claim 1, wherein the first amplifier and the second amplifier comprise Continuous Time Linear Equalization (CTLE) amplifiers.

7. The device of claim 1, further comprising one or more processor cores.

8. A system comprising:
a first agent to generate differential communication signals; and
a second agent coupled to the first agent to receive the differential communication signals, the second agent to comprise:
at least one Continuous Time Linear Equalization (CTLE) amplifier to receive the differential communication signals;
at least two comparators to receive differential output signals from the CTLE amplifier; and
at least one offset adjustment logic to generate an offset adjustment signal to cause the CTLE amplifier to equalize the differential output signals,
wherein the at least two comparators are to be clocked by clock signals that are interleaved.

9. The system of claim 8, wherein the clock signals are 180 degrees out of phase.

10. The system of claim 8, further comprising a network fabric to couple the first agent and the second agent.

11. The system of claim 8, further comprising a plurality of CTLE amplifiers to receive the differential communication signals.

12. The system of claim 11, further comprising a plurality of offset adjustment logics to generate a plurality of offset adjustment signals to cause the plurality of CTLE amplifiers to equalize their respective differential output signals.

13. The system of claim 11, wherein differential output signals from a first one of the plurality of CTLE amplifiers are coupled to a first one of the at least two comparators and differential output signals from a second one of the plurality of CTLE amplifiers are coupled to a second one of the at least two comparators.

14. The system of claim 8, wherein the first agent and the second agent are coupled via a point-to-point interface.

15. A method comprising:
generating, at a first agent, differential communication signals;
receiving, at a second agent, the differential communication signals, wherein
receiving at the second agent is to comprise receiving, at a Continuous Time Linear Equalization (CTLE) amplifier, the differential communication signals;
receiving, at two comparators, differential output signals from the CTLE amplifier; and
generating, at an offset adjustment logic, an offset adjustment signal to cause the CTLE amplifier to equalize the differential output signals,
wherein the two comparators are to be clocked by clock signals that are interleaved.

16. The method of claim 15, wherein the clock signals are 180 degrees out of phase.

17. The method of claim 15, further comprising coupling the first agent and the second agent via a network fabric.

18. The method of claim 15, further comprising generating, at a plurality of offset adjustment logics, a plurality of offset adjustment signals to cause a plurality of CTLE amplifiers to equalize their respective differential output signals.

19. The method of claim 18, further comprising coupling differential output signals from a first one of the plurality of CTLE amplifiers to a first one of the two comparators and coupling differential output signals from a second one of the plurality of CTLE amplifiers to a second one of the two comparators.

20. The method of claim 15, further comprising the first agent and the second agent via a point-to-point interface.

* * * * *